US008035439B2

(12) United States Patent
Chuang et al.

(10) Patent No.: US 8,035,439 B2
(45) Date of Patent: Oct. 11, 2011

(54) MULTI-CHANNEL INTEGRATOR

(75) Inventors: Kai-Lan Chuang, Tainan County (TW); Guo-Ming Lee, Tainan County (TW); Ying-Lieh Chen, Tainan County (TW)

(73) Assignee: Himax Technologies Limited, Tainan (TW)

( * ) Notice: Subject to any disclaimer, the term of this patent is extended or adjusted under 35 U.S.C. 154(b) by 122 days.

(21) Appl. No.: 12/563,373

(22) Filed: Sep. 21, 2009

(65) Prior Publication Data

US 2011/0068848 A1 Mar. 24, 2011

(51) Int. Cl.
*H03K 5/00* (2006.01)

(52) U.S. Cl. ........................................ 327/337; 327/554

(58) Field of Classification Search .......... 327/336-337, 327/551-559

See application file for complete search history.

(56) References Cited

U.S. PATENT DOCUMENTS 7,791,032 B2 * 9/2010 Karim ...................... 250/370.09
7,884,662 B1 * 2/2011 Chuang et al. ................ 327/337

* cited by examiner

*Primary Examiner* — Dinh T. Le
(74) *Attorney, Agent, or Firm* — J.C. Patents

(57) ABSTRACT

A multi-channel integrator is provided. The multi-channel integrator includes an integrator and a plurality of channels. Each of the channels includes an input selector and a unit-gain amplifier. The input selector has a common terminal, a first selecting terminal and a second selecting terminal. The input selector selectively electrically connects the common terminal to the first selecting terminal or to the second selecting terminal. The first selecting terminal of the input selector is coupled to an input terminal of the integrator. An input terminal of the unit-gain amplifier is coupled to the second selecting terminal of the input selector.

21 Claims, 7 Drawing Sheets

MULTI-CHANNEL INTEGRATOR

BACKGROUND OF THE INVENTION

1. Field of the Invention

The present invention relates to an integrator, and more particularly, to a multi-channel integrator.

2. Description of Related Art

With the blooming development in the electronic technology, and the prevalence of wireless communication and the internet, a variety of electronic devices are becoming indispensable in people's day-to-day life and work. However, it is rather difficult to operate the most common input-output (I/O) interface, such as a keyboard or a mouse. Compared with a keyboard and a mouse, touch panel is a simpler I/O interface. Therefore, the touch panel is usually applied as a man-machine interface between a man and an electronic device.

Generally speaking, the touch panel can be classified into a resistive touch panel, an optics touch panel, and a capacitive touch panel, etc. On the other hand, the touch panel can also be classified into a current-type touch panel and a charge type touch panel when being classified in a readout manner. FIG. 1 is a schematic diagram of a capacitive touch panel and a traditional readout circuit. A common capacitive touch panel 110 has a plurality of sensor lines both in the Y-axis direction and in the X-axis direction. A coupling capacitor Cp is formed between one of the sensor lines in the Y-axis direction and one of the sensor lines in the X-axis direction.

Each of the sensor lines is with an integrator 120. Besides, an operational amplifier (OP-AMP) 122 and a feedback capacitor Cfb are disposed in each of the integrators 120. In the beginning, a non-inverting input terminal of each of the OP-AMPs 122 receives a 0V reference voltage $V_{ref}$, and each of switches 123 is turned on. Thus, each of the sensor lines is charged to 0V. Next, each of the integrators 120 turns off the switch 123 thereof so as to perform a readout operation. If no conductor, such as a finger, is approached to or touches the touch panel 110 during a turn off period of the switch 123, the voltage of two terminals of the coupling capacitor Cp are changed to 5V by the integrators 120 in the Y-axis direction and in the X-axis direction as the reference voltage $V_{ref}$ is transferred from 0V to 5V. Since there is no need to charge and discharge the coupling capacitor Cp, the variation that the reference voltage $V_{ref}$ is transferred from 0V to 5V is reflected on the output of integrator 120. After each of the integrators 120 complete the readout operation, each of the switches 123 are turned on again. And the above-mentioned steps are repeated all over again.

When a conductor, such as a finger, touches the touch panel 110, an extra capacitor Cf is formed at a corresponding location as shown in FIG. 1. During the turn off period of the switch 123, when the reference voltage $V_{ref}$ is transferred from 0V to 5V, the corresponding integrator 120 needs to charge and discharge the extra capacitor Cf through one of the sensor lines. Hence, the output OUT of the integrator 120 corresponding to the extra capacitor Cf changes as the reference voltage $V_{ref}$ is transferred from 0V to 5V, which is represented as $OUT=5+[(5V-0V)\times Cf]/Cfb$. The integrator 120 transmits the readout result to following circuits, which includes a digital to analog convertor and an image processing circuit (not shown), so that the location coordinate is determined. Hence, the touch location is determined upon the difference readout data between the sensor line with the extra capacitor Cf and the sensor line without the extra capacitor Cf.

From the foregoing equation, the larger the extra capacitor Cf is, the larger the feedback capacitor Cfb is needed. Otherwise, the touch location can not be determined due to the output saturation of the integrator 120. However, in order to prevent the output saturation of the integrator 120, the capacitance of the feedback capacitor Cfb is needed to be increased, i.e. the area of the feedback capacitor Cfb is needed to be increased. Since each of the sensor lines needs one integrator 120, the chip area occupied by the integrator 120 is significantly large.

SUMMARY OF THE INVENTION

The present invention provides a multi-channel integrator to reduce a chip area.

The present invention provides a multi-channel integrator including an integrator and a plurality of channels. Each of the channels includes an input selector and an unit-gain amplifier. The input selector has a common terminal, a first selecting terminal, and a second selecting terminal so as to selectively electrically connect the common terminal to the first selecting terminal or to the second selecting terminal. Besides, the first selecting terminal of the input selector is coupled to an input terminal of the integrator. An input terminal of the unit-gain amplifier is coupled to the second selecting terminal of the input selector.

The present invention provides a multi-channel integrator including an integrator and a plurality of channels. Each of the channels includes an input selector. The input selector selectively connects an input terminal of the integrator or a reference voltage to a common terminal of the input selector.

According to an embodiment of the present invention, the aforesaid integrator includes a first operation amplifier (OP-AMP), a feedback capacitor, and a feedback switch. A first input terminal of the first OP-AMP serves as the input terminal of the integrator, a second input terminal of the first OP-AMP receives the reference voltage, and an output terminal of the first OP-AMP serves as an output terminal of the integrator. A first terminal and a second terminal of the feedback capacitor are respectively coupled to the first input terminal and the output terminal of the first OP-AMP. A first terminal and a second terminal of the feedback switch are respectively coupled to the first input terminal and the output terminal of the first OP-AMP.

According to an embodiment of the present invention, during a first channel period, the aforesaid feedback switch is turned off, the input selector of a $1^{st}$ channel of the channels selectively electrically connects the common terminal thereof to the first selecting terminal thereof, and the input selector of each of the other channels selectively electrically connects the common terminal thereof to the second selecting terminal thereof.

Accordingly, the channels of the multi-channel integrator share an integrator by turns, so that the chip area is significantly reduced as well as the cost.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The following embodiments use a capacitive touch panel as an example to illustrate the application of a multi-channel integrator of the present invention. However, the embodiments are not intended to limit the present invention. The present invention may not only be applied to a charge type touch panel, but also to a circuit or an electronic product that needs a multi-channel integrator according to the teaching of the embodiments of the present invention.

Figure 1:
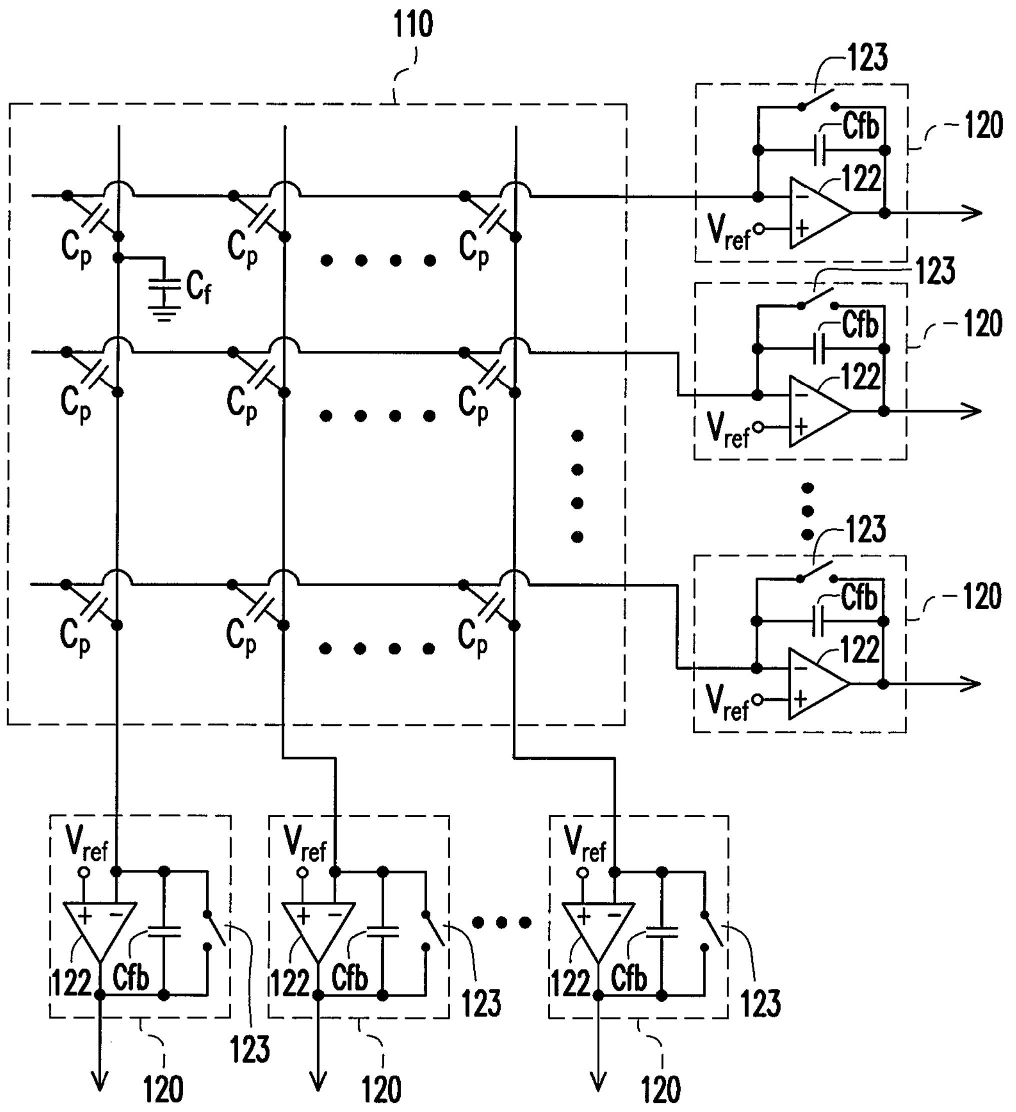
FIG. 1 (RELATED ART)
FIG. 1 is a schematic diagram of a capacitive touch panel and a traditional readout circuit.
Figure 2:
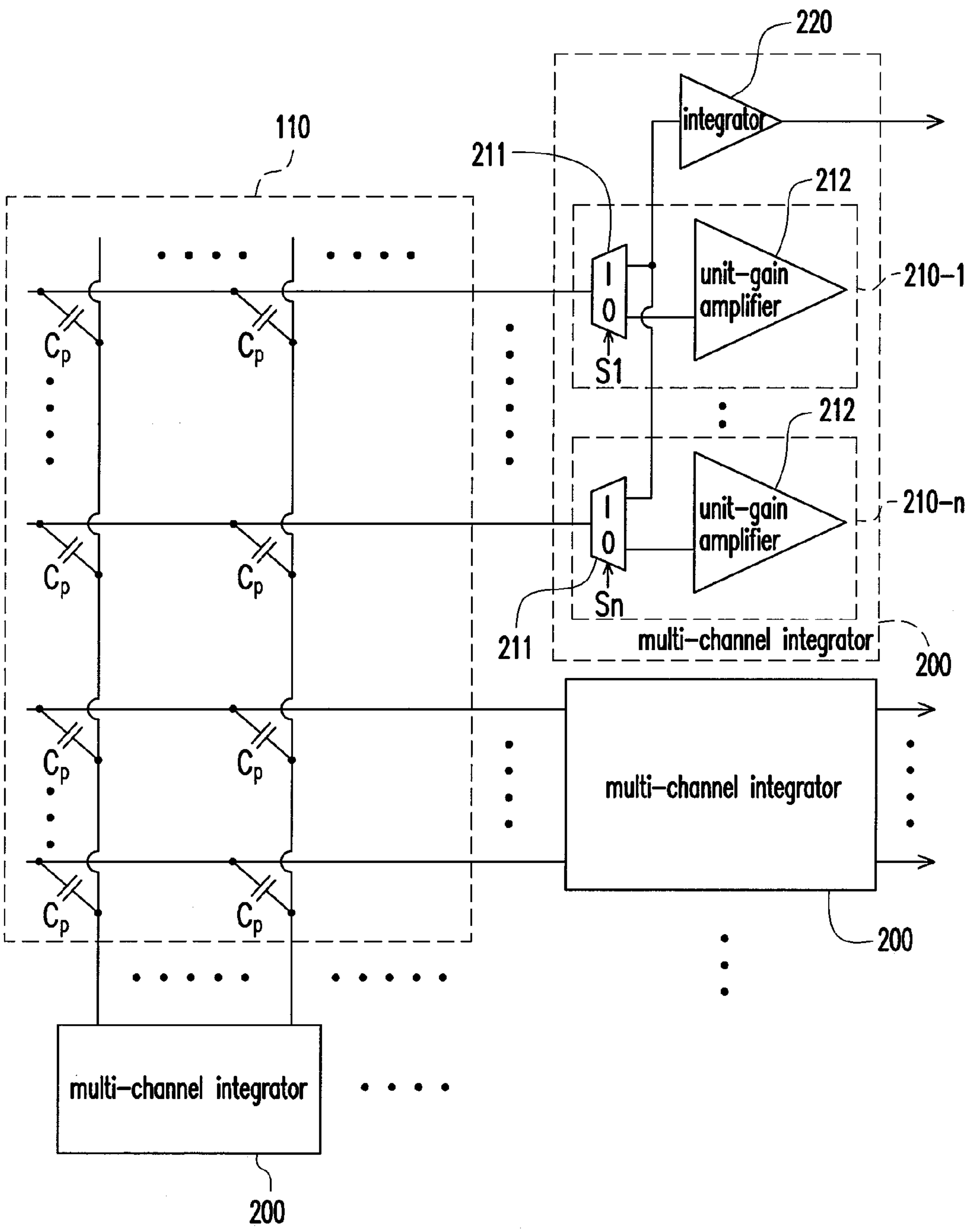
FIG. 2 is a circuit diagram of a multi-channel integrator in an embodiment of the present invention.

FIG. 2 is a circuit diagram of a multi-channel integrator in an embodiment of the present invention. The multi-channel integrator 200 includes n channels **210-1~210-*n*. In the drawing, only $1^{st}$ and $n^{th}$ of the channels are depicted. The other channels may be embodied with reference according to the $1^{st}$ channel 210-1. Besides, the multi-channel integrator 200 further includes an integrator 220. The channels 210-1~210-*n* share the integrator 220 by turns, so that the chip area is significantly reduced as well as the cost. A detail description that how the channels 210-1~210-*n* use the integrator 220** by turns is provided in the following paragraph.

Referring to FIG. 2, the implementations of the channels **210-1~210-*n* are identical in the embodiment. For example, the channel 210-1 includes an input selector 211 and an unit-gain amplifier 212. The input selector 211 has a common terminal, a first selecting terminal, and a second selecting terminal. Besides, an input terminal of the unit-gain amplifier 212 is coupled to the second selecting terminal of the input selector 211. An input terminal of the integrator 220 is coupled to the first selecting terminal of each of the channels 210-1~210-*n*. In the channel 210-1, the common terminal of the input selector 211 is coupled to a $1^{st}$ sensor line of the touch panel 110. In the channel 210-*n*, the common terminal of the input selector 211 is coupled to an $n^{th}$ sensor line of the touch panel 110. The input selector 211 of the channel 210-1 is controlled by a control signal S1, and the input selector 211 of the channel 210-*n* is controlled by a control signal Sn. The input selector 211** selectively electrically connects the common terminal to the first selecting terminal, or electrically connects the common terminal to the second selecting terminal according to the corresponding control signal.

Figure 3:
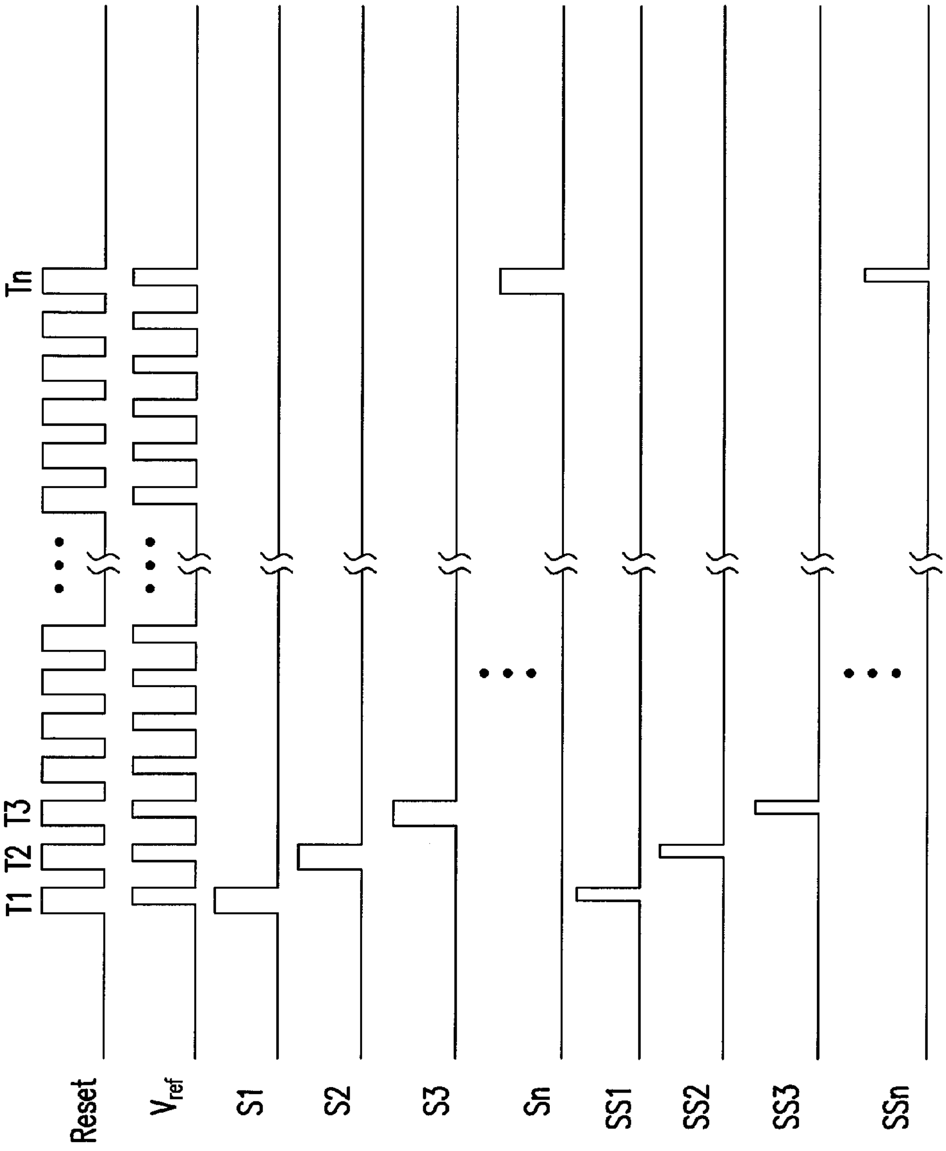
FIG. 3 is a diagram showing a timing control of each of control signals in FIG. 2 in an embodiment of the present invention.

FIG. 3 is a diagram showing a timing control of each of control signals S1~Sn in FIG. 2 in an embodiment of the present invention. Referring to both FIG. 2 and FIG. 3, when a system is during a power-on period or a reset period, the system sets a reset signal Reset to an enable state, such as to a logic-low level. When the reset signal Reset is in the logic-low level, the input selector 211 of each of the channels **210-1~210-*n* selectively electrically connects the common terminal to the second selecting terminal, so that the unit-gain amplifiers 212 are coupled to the sensor lines of the touch panel 110**.

When a first channel period T1 starts, the control signal S1 is transferred to a logic-high level, and other control signals S2~Sn are maintained in the logic-low level. Hence, during the first channel period T1, the input selector of the $1^{st}$ channel 210-1 selectively electrically connects the common terminal thereof to the first selecting terminal thereof, and the input selector 211 of each of the other channels (such as the channel **210-*n*) selectively electrically connects the common terminal thereof to the second selecting terminal thereof. Then, the channel 210-1 can use the integrator 220 during the first channel period T1. In addition, the input terminal of the inner unit-gain amplifier 212 of each of the other channels is coupled to the corresponding sensor line of the touch panel 110** so as to serve as the input terminal of "integrator".

During the period that a current channel period (e.g. the first channel period T1) finishes and a next channel period (e.g. a second channel period T2) does not yet start (equivalent to the reset period), the system sets the reset signal Reset to the logic-low level as shown in FIG. 3. Then, the control signal S1 is transferred to the logic-low level. During the period, the input selector 211 of each of the channels **210-1~210-*n* selectively electrically connects the common terminal to the second selecting terminal, so that the input terminal of the unit-gain amplifiers 212 are coupled to the sensor lines of the touch panel 110**.

Then, a second channel period T2 starts. During the second channel period T2, the control signal S2 is transferred to a logic-high level, and the other control signals S1, S3~Sn are maintained in the logic-low level. Thus, the $2^{nd}$ channel (not shown in FIG. 2, and it can be embodied with reference according to the description of the channel 210-1) uses the integrator 220 during the second channel period T2. In addition, the input terminal of the inner unit-gain amplifier 212 of each of the other channels is coupled to the corresponding sensor line of the touch panel 110 so as to serve as the input terminal of "integrator". Accordingly, when the $n^{th}$ channel period Tn starts, the $n^{th}$ channel **210-*n* uses the integrator 220. Besides, the input terminal of the inner unit-gain amplifier 212 of each of the other channels is coupled to the corresponding sensor line of the touch panel 110. The operation details of the second channel period T2, the third channel period T3 . . . and the $n^{th}$ channel period Tn can be referred to the description of the first channel period T1**. Detailed descriptions are not repeated.

Besides, a following circuit, such as a digital to analog convertor and/or image processing circuit (not shown), is coupled to the output terminal of the integrator 220. Hence, the following circuit respectively receives readout signals of the sensor lines, so that a touch location of the touch panel 110 is determined.

Figure 4:
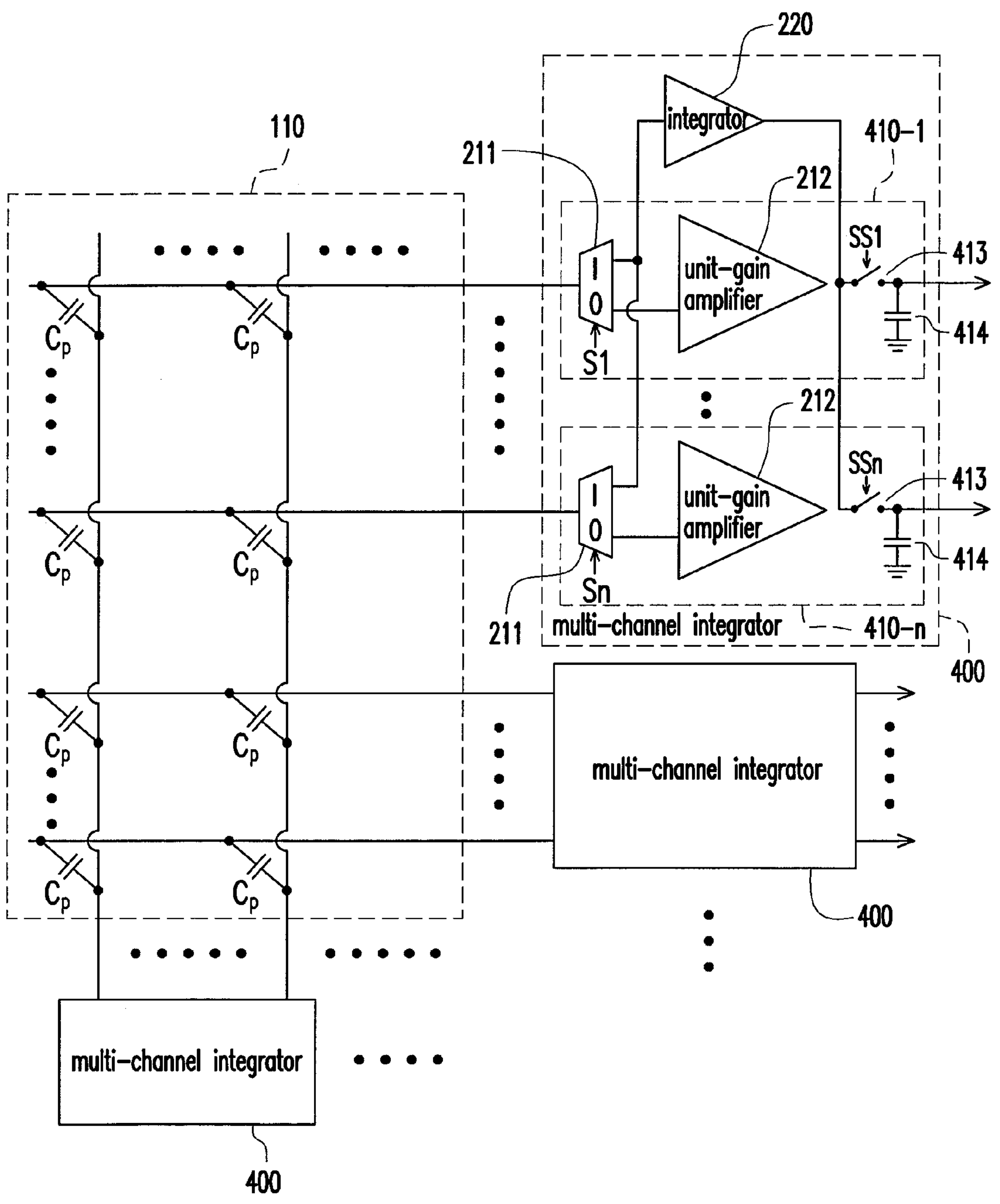
FIG. 4 is another circuit diagram of a multi-channel integrator in an embodiment of the present invention.

FIG. 4 is another circuit diagram of a multi-channel integrator in an embodiment of the present invention. The multi-channel integrator 400 has n channels **410-1~410-*n*. In the drawings, only a $1^{st}$ channel 410-1 and an $n^{th}$ channel 410-*n* of the channels are depicted. The other channels may be embodied with reference according to the $1^{st}$ channel 410-1. The embodiment in FIG. 4 is similar to that in FIG. 2. The detailed descriptions of similar items are not repeated. The difference between FIG. 4 and FIG. 2 is that each of the channels 410-1~410-*n* in FIG. 4 further includes a sampling switch 413 and a sampling capacitor 414**.

Referring to FIG. 4, the implementations of the channels **410-1~410-*n* are identical in the embodiment. In the following, the channel 410-1 is used as an example to illustrate the design and working of the present invention. In the channel 410-1, a first terminal of the sampling switch 413 is coupled to the output terminal of the integrator 220. The sampling switches 413 of the channels 410-1~410**-*n* are respectively controlled by control signals SS1, SS2, SS3, . . . SSn (referring to FIG. 3). A first terminal of the sampling capacitor 414 is coupled to a second terminal of the sampling switch 413, and a second terminal of the sampling capacitor 414 receives a second reference voltage, such as a ground voltage.

Referring to both FIG. 3 and FIG. 4, when the first channel period T1 starts, the control signal S1 and SS1 is transferred to the logic-high level, and the other control signals S2~Sn and SS2~SSn are maintained in the logic-low level. Hence, during the first channel period T1, the input selector 211 of the 1$^{st}$ channel 410-1 selectively electrically connects the common terminal thereof to the first selecting terminal thereof, and the sampling switch 413 of the 1$^{st}$ channel 410-1 is turned on so that an output of the integrator 220 is stored in the sampling capacitor 414 of the 1$^{st}$ channel 410-1. Meanwhile, the input selector 211 of each of the other channels (such as the channel 410-*n*) selectively electrically connects the common terminal thereof to the second selecting terminal thereof, and the sampling switch 413 of each of the other channels is turned off. Accordingly, when the n$^{th}$ channel period Tn starts, the n$^{th}$ channel 410-*n* uses the integrator 220, and the output of the integrator 220 is stored in the sampling capacitor 414 of the n$^{th}$ channel 410-*n*. The operation details of the second channel period T2, the third channel period T3 . . . and the n$^{th}$ channel period Tn can be referred to the description of the first channel period T1. Detailed descriptions are not repeated.

Since the sampling capacitor 414 of each of the channels 410-1~410*n* has already stored the readout signal of the corresponding sensor line of the touch panel 110, the following circuit, for example a digital-to-analog convertor and/or image processing circuit (not shown) is able to read the signal of each of the sampling capacitors 414, such that the touch location of the touch panel 110 is determined.

Figure 5:
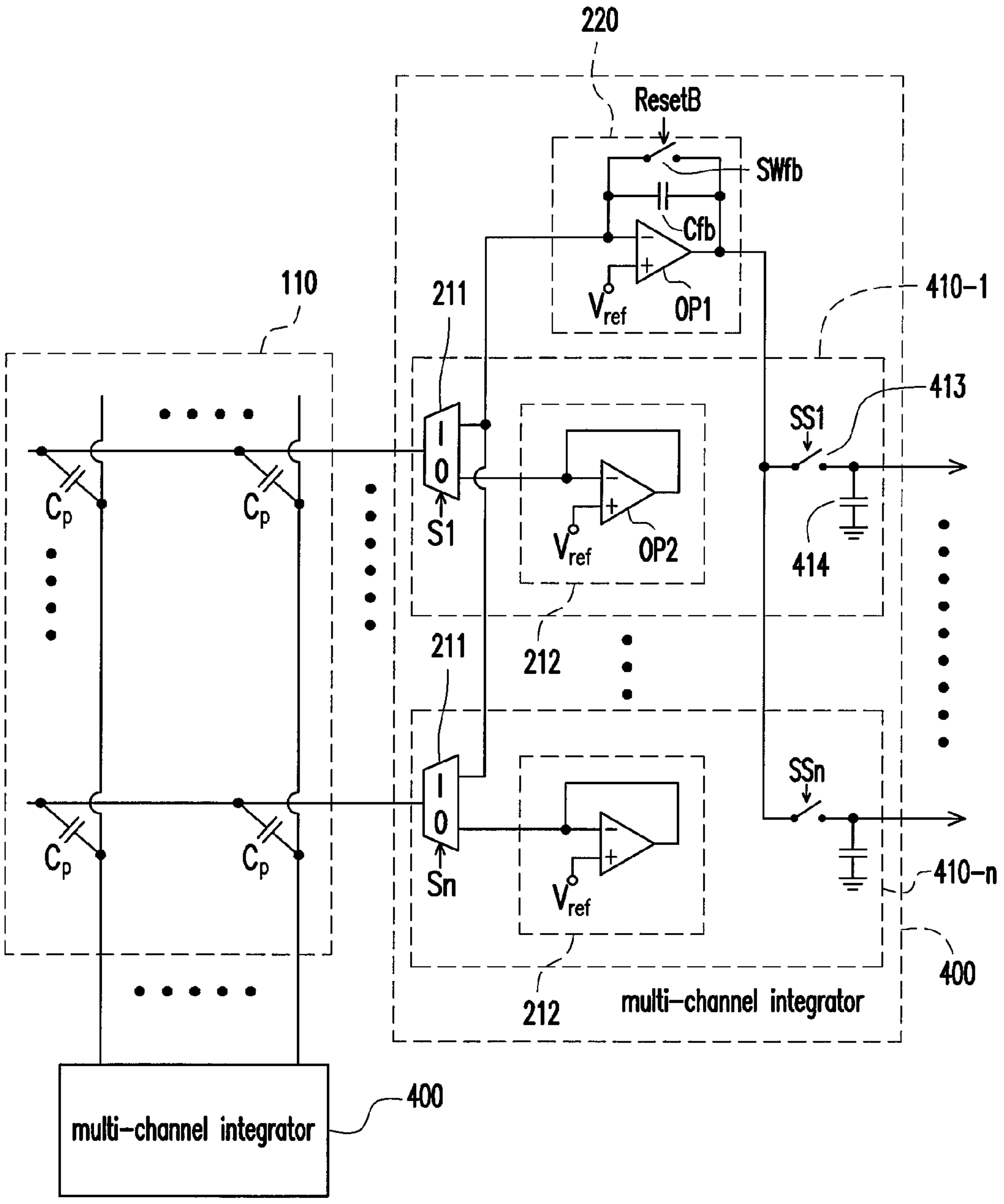
FIG. 5 is a circuit diagram of a multi-channel integrator in FIG. 4 in an embodiment of the present invention.

FIG. 5 is a circuit diagram of the multi-channel integrator 400 in FIG. 4 in an embodiment of the present invention. Referring to FIG. 5, the unit-gain amplifier 212 includes a second operational amplifier (OP-AMP) OP2. A first input terminal of the second OP-AMP OP2 is coupled to the second selecting terminal of the input selector 211, and a second input terminal of the second OP-AMP OP2 receives a reference voltage $V_{ref}$, an output terminal of the second OP-AMP OP2 is coupled to the first input terminal of the second OP-AMP OP2. In the embodiment, the first input terminal of the second OP-AMP OP2 is an inverting input terminal, and the second input terminal of the second OP-AMP OP2 is a non-inverting input terminal.

In addition, designers may design the levels of the reference voltage $V_{ref}$ based on the design requirement. For example, the level of the reference voltage $V_{ref}$ is set to half of a system voltage VDDA (i.e. VDDA/2), a band-gap voltage, +5V, or other fixed voltages. In the embodiment, the reference voltage $V_{ref}$ is set to a time-variant voltage responding to the reset signal Reset. When the reset signal Reset is in the logic-low level, the reference voltage $V_{ref}$ is a ground voltage, i.e. 0V. When the reset signal Reset is transferred to the logic-high level, the reference voltage $V_{ref}$ responds to the reset signal Reset and is transferred to half of the system voltage VDDA, such as +5V.

Referring to FIG. 5, the integrator 220 includes a first OP-AMP OP1, a feedback capacitor Cfb, and a feedback switch SWfb. A first input terminal of the first OP-AMP OP1 is coupled to the first selecting terminal of the input selector 211 of each of the channels 410-1~410-*n*, and a second input terminal of the first OP-AMP OP1 receives the reference voltage $V_{ref}$. In the embodiment, the first input terminal of the first OP-AMP OP1 is an inverting input terminal, and the second input terminal of the first OP-AMP OP1 is a non-inverting input terminal. A first terminal and a second terminal of the feedback capacitor Cfb are respectively coupled to the first input terminal and the output terminal of the first OP-AMP OP1. A first terminal and a second terminal of the feedback switch SWfb are also respectively coupled to the first input terminal and the output terminal of first OP-AMP OP1. The feedback switch SWfb is controlled by a signal ResetB inverted from the reset signal Reset.

Referring to both FIG. 3 and FIG. 5, when the system is during the power-on period or the reset period, the system sets the reset signal Reset to the logic-low level (i.e. the signal ResetB is set to the logic-high level), such that the feedback switch SWfb is turned on and the feedback capacitor Cfb is reset. In addition, since the control signals S1~Sn are all in the logic-low level, the input selector 211 of each of the channels 410-1~410-*n* selectively electrically connects the sensor line of the touch panel 110 to the unit-gain amplifier 212.

When the first channel period T1 starts, the system sets the reset signal Reset to the logic-high level (i.e. the signal ResetB is set to the logic-low level) so as to turn off the feedback switch SWfb. Hence, the integrator 220 performs an integrating operation. During the period, the control signal S1 responds to the reset signal Reset and is transferred to the logic-high level, and the other control signals S2~Sn are maintained in the logic-low level. Hence, during the first channel period T1, the inverting input terminal of the first OP-AMP OP1 is electrically connected to the sensor line corresponding to the 1$^{st}$ channel 410-1, and an output of the first OP-AMP OP1 is stored in the sampling capacitor 414 of the 1$^{st}$ channel 410-1. The unit-gain amplifier 212 of each of the other channels (such as the channel 410-*n*) is electrically connected to the other sensor line of the touch panel 110.

During the period that a current channel period (e.g. the first channel period T1) finishes and a next channel period (e.g. a second channel period T2) does not yet start (equivalent to the reset period), the system sets the reset signal Reset to the logic-low level as shown in FIG. 3. Hence, the control signal S1 is transferred to the logic-low level. During the period, the input selector 211 of each of the channels 410-1~410-*n* selectively electrically connects the common terminal to the second selecting terminal, so that all of the unit-gain amplifiers 212 are coupled to the sensor lines of the touch panel 110. In the integrator 220, the signal ResetB controls and turns on the feedback switch SWfb, so as to reset the feedback capacitor Cfb. Accordingly, when the n$^{th}$ channel period Tn starts, the n$^{th}$ channel 410-*n* uses the integrator 220, and the output of the integrator 220 is stored in the sampling capacitor 414 of the n$^{th}$ channel 410-*n*. The operation details of the second channel period T2, the third channel period T3 . . . and the n$^{th}$ channel period Tn can be referred to the description of the first channel period T1. Detailed descriptions are not repeated.

Figure 6:
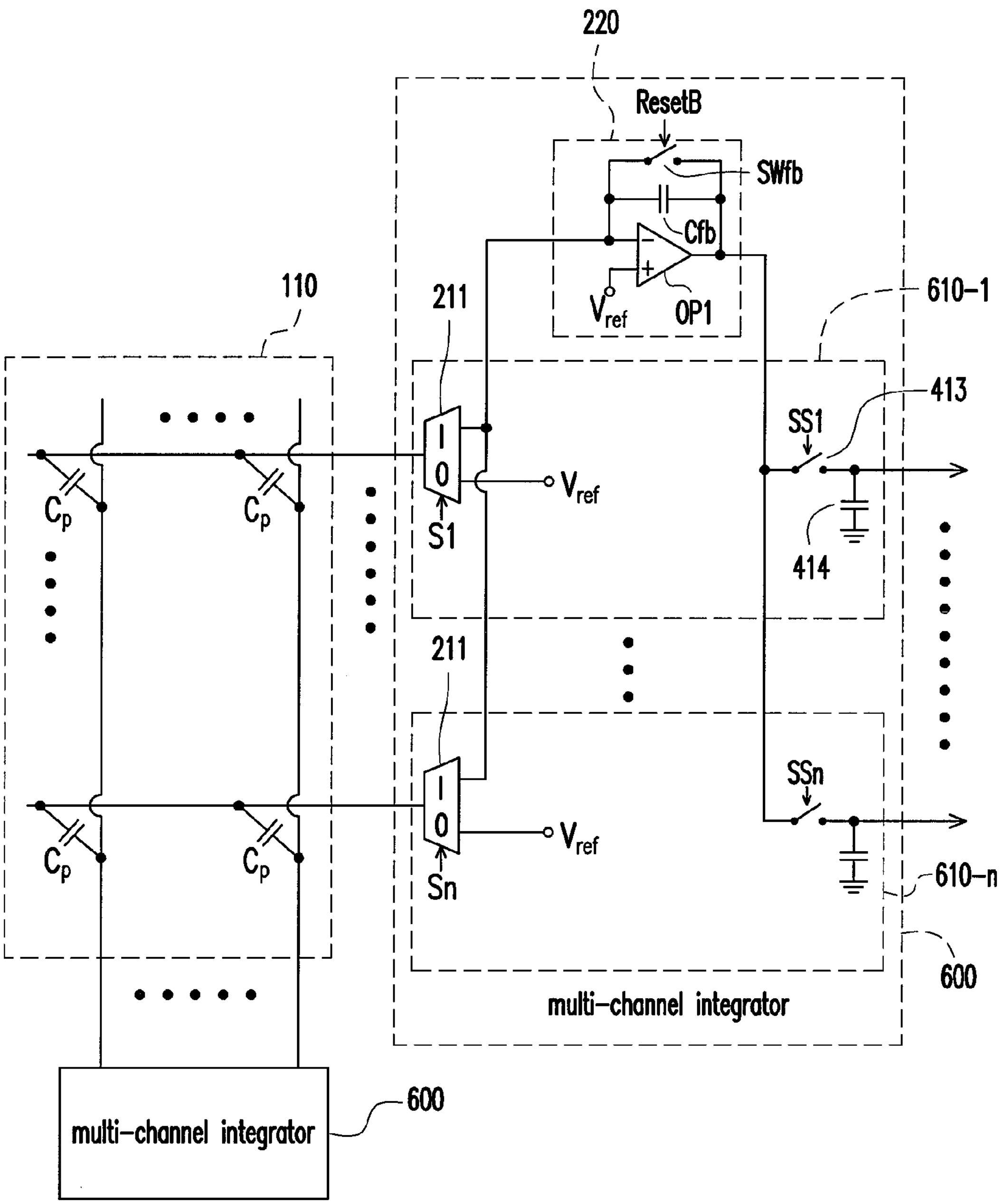
FIG. 6 is a circuit diagram of a multi-channel integrator in another embodiment of the present invention.

FIG. 6 is a circuit diagram of a multi-channel integrator in another embodiment of the present invention. The embodiment in FIG. 6 is similar to that in FIG. 5. The detailed descriptions of similar items are not repeated. The difference between FIG. 6 and FIG. 5 is that there is no unit-gain amplifier 212 in each of the channels in FIG. 6. Referring to FIG. 6, a multi-channel integrator 600 includes the integrator 220 and a plurality of channels 610-1~610-*n*. In the drawings, only a 1$^{st}$ channel 610-1 and an n$^{th}$ channel 610-*n* of the channels are depicted. The other channels may be embodied with reference according to the 1$^{st}$ channel 610-1. In the embodiment, the implementations of the channels 610-1 to 610-*n* are identical. In the following, the channel 610-1 is used as an example to illustrate the design and working of the present invention. The channel 610-1 includes the input selector 211, the sampling switch 413, and the sampling capacitor 414. In another embodiment, the sampling switch 413 and the sampling capacitor 414 may be omitted similar to the channels 210-1~210-*n* as shown in FIG. 2.

Referring to FIG. 6, in each of the channels 410-1~410-*n*, the first selecting terminal of the input selector 211 is coupled to the input terminal of the integrator 220, and the second selecting terminal of the input selector 220 receives the reference voltage $V_{ref}$. The input selector 211 of the channel 610-1 selectively electrically connects the common terminal to the first selecting terminal or electrically connects the common terminal to the second selecting terminal according to the control signal S1. Hence, when the control signal S1 is in the logic-high level, the input selector 211 of the channel 610-1 selectively electrically connects the sensor line of the touch panel 110 to the input terminal of the integrator 220. Then, when the control signal SS1 is in the logic-high level, the sampling switch 413 of the channel 610-1 transmits the output of the integrator 220 to the sampling capacitor 414 of the channel 610-1. On the other hand, when the control signal S1 is in the logic-low level, the input selector 211 of the channel 610-1 selectively electrically connects the sensor line of the touch panel 110 to the reference voltage $V_{ref}$. Meanwhile, the control signal SS1 is in the logic-low level, and the sampling switch 413 of the channel 610-1 is turned off.

Figure 7:
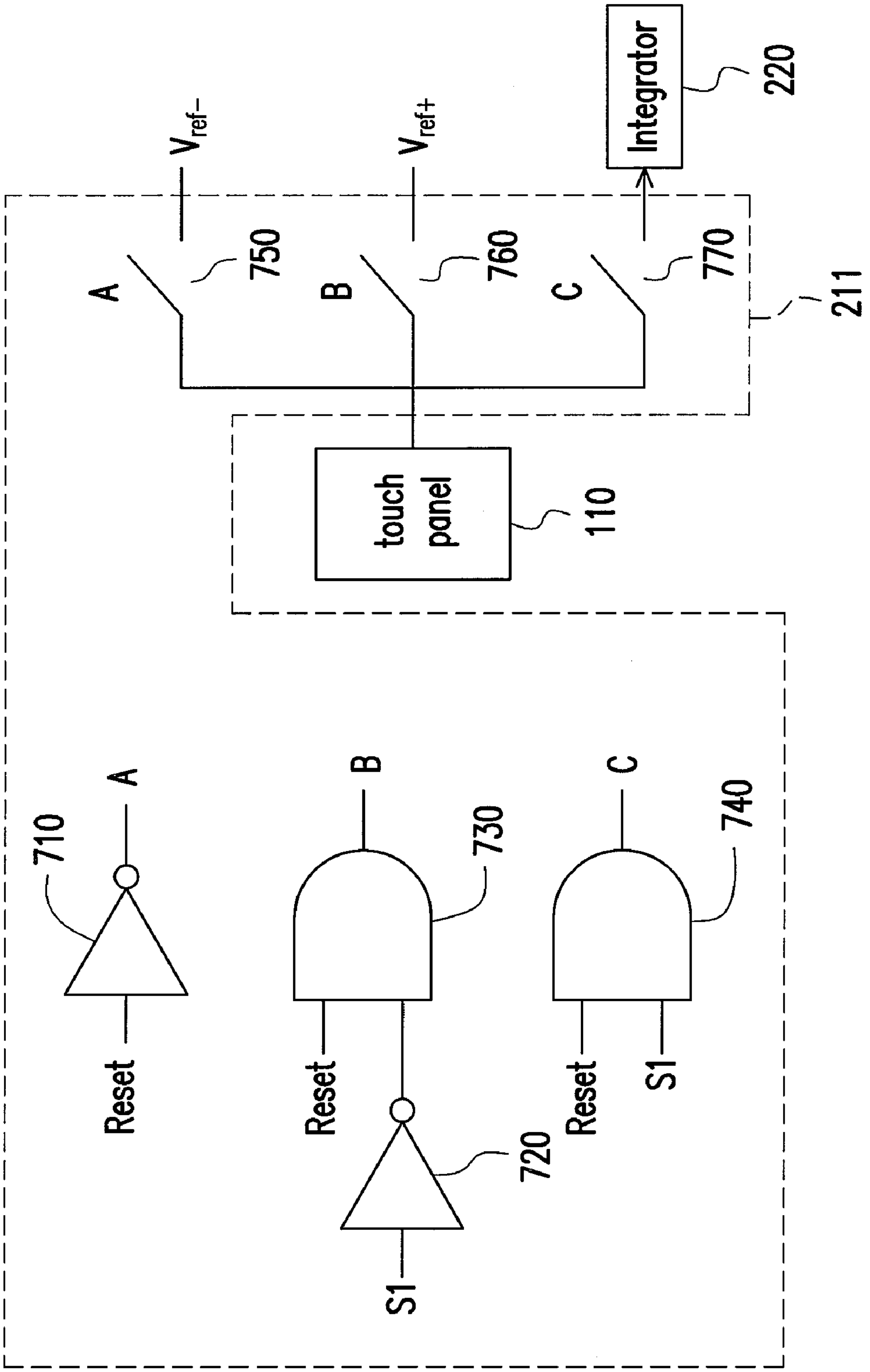
FIG. 7 is a circuit diagram of the input selector 211 of FIG. 6 in another embodiment of the present invention.

FIG. 7 is a circuit diagram of the input selector 211 of FIG. 6 in another embodiment of the present invention. The implementations of the input selectors 211 of the channels 610-1~610-*n* are identical in the embodiment. Referring to FIG. 6, the input selector 211 of the channel 610-1 includes a first NOT gate 710, a second NOT gate 720, a first AND gate 730, a second AND gate 740, a first switch 750, a second switch 760 and a third switch 770. First terminals of the switches 750~770 are coupled to the sensor line of the touch panel 110. A second terminal of the third switch 770 is coupled to the integrator 220. The reference voltage $V_{ref}$ includes a high voltage $V_{ref+}$ and a low voltage $V_{ref-}$. A second terminal of the second switch 760 is coupled to the high voltage $V_{ref+}$ which is set to logic-high level of the reference voltage $V_{ref}$ (i.e. half of a system voltage VDDA). A second terminal of the first switch 750 is coupled to the low voltage $V_{ref-}$ which is set to logic-low level of the reference voltage $V_{ref}$ (i.e. 0V). The switches 750~770 are controlled by the NOT gate 710, the AND gates 730 and 740, respectively.

An input terminal of the first NOT gate 710 receives the reset signal Reset. An output terminal of the first NOT gate 710 couples to a control terminal of the first switch 750. First input terminals of the AND gates 730 and 740 receive the reset signal Reset. An output terminal of the second NOT gate 720 is coupled to a second input terminal of the first AND gate 730. An output terminal of the first AND gate 730 couples to a control terminal of the second switch 760. An output terminal of the second AND gate 740 couples to a control terminal of the third switch 770. An input terminal of the second NOT gate 720 and a second input terminal of the AND gate 740 in the channel 610-1 receive the control signal S1. Similarly, the input terminal of the second NOT gate 720 and the second input terminal of the second AND gate 740 in the channel 610-*n* receive the control signal Sn.

Referring to both FIG. 3 and FIG. 7, when the system sets the reset signal Reset to the logic-low level, such that the first switch 750 is turned on and the switches 760 and 770 are turned off. When the system sets the reset signal Reset to the logic-high level, and the control signals S1 is set to the logic-high level, such that the third switch 770 is turned on and the switches 750 and 760 are turned off. When the system sets the reset signal Reset to the logic-high level, and the control signals S1 is set to the logic-low level, such that the second switch 760 is turned on and the switches 750 and 770 are turned off.

In summary, the channels of the above-mentioned embodiments share one set integrator 220 by turns. And the more the channel number n of the multi-channel integrator is, the larger the chip area is reduced. Hence, the chip area of the multi-channel integrator is significantly reduced as well as the cost.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A multi-channel integrator comprising:

an integrator; and a plurality of channels, wherein each of the channels comprises:

an input selector having a common terminal, a first selecting terminal, and a second selecting terminal so as to selectively electrically connect the common terminal to the first selecting terminal or to the second selecting terminal, wherein the first selecting terminal is coupled to an input terminal of the integrator;

an unit-gain amplifier having an input terminal coupled to the second selecting terminal of the input selector;

a sampling switch having a first terminal couple to the output terminal of the integrator; and a sampling capacitor having a first terminal coupled to a second terminal of the sampling switch, having a second terminal receiving a second reference voltage.

2. The multi-channel integrator of claim 1, wherein the integrator comprises:

a first operational amplifier (OP-AMP) having a first terminal serving as the input terminal of the integrator, having a second terminal receiving a reference voltage, having an output terminal serving as an output terminal of the integrator;

a feedback capacitor having a first terminal and a second terminal respectively coupled to the first input terminal and the output terminal of the first OP-AMP; and a feedback switch having a first terminal and a second terminal respectively coupled to the first input terminal and the output terminal of the first OP-AMP.

3. The multi-channel integrator of claim 2, wherein during a power-on period, the feedback switch is turned on, and the input selector of each of the channels selectively electrically connects the common terminal to the second selecting terminal.

4. The multi-channel integrator of claim 2, wherein during a reset period, the feedback switch is turned on, and the input selector of each of the channels selectively electrically connects the common terminal to the second selecting terminal.

5. The multi-channel integrator of claim 2, wherein during a period of one of a plurality of channel periods for the integrator performing the integrating operation, the feedback switch is turned off, the input selector of a corresponding channel of the channels selectively electrically connects the common terminal thereof to the first selecting terminal thereof, and the input selector of each of the other channels selectively electrically connects the common terminal thereof to the second selecting terminal thereof.

6. The multi-channel integrator of claim 2, wherein during a period after the time when a current one of a plurality of channel periods finishes and before the time when a next one of the plurality of the channel periods does not yet start, wherein the integrator performs the integrating operation during the channel periods, the feedback switch is turned on, and the input selector of each of the channels selectively electrically connects the common terminal to the second selecting terminal.

7. The multi-channel integrator of claim 2, wherein the first input terminal of the first OP-AMP is an inverting input terminal, and the second input terminal of the first OP-AMP is a non-inverting input terminal.

8. The multi-channel integrator of claim 1, wherein the unit-gain amplifier comprises a second OP-AMP having a first input terminal coupled to the second selecting terminal of the input selector, having a second input terminal receiving a reference voltage, having an output terminal coupled to the first input terminal of the second OP-AMP.

9. The multi-channel integrator of claim 8, wherein the first input terminal of the second OP-AMP is an inverting input terminal, and the second input terminal of the second OP-AMP is a non-inverting input terminal.

10. The multi-channel integrator of claim 1, wherein during a period of one of a plurality of channel periods for the integrator performing the integrating operation, the sampling switch of a corresponding channel of the channels is turned on, and the sampling switch of each of the other channels is turned off.

11. The multi-channel integrator of claim 1, wherein the multi-channel integrator is used to sense a touch panel, and the common terminals of the input selectors are coupled to sensor lines of the touch panel respectively.

12. A multi-channel integrator comprising:
- an integrator; and
- a plurality of channels, wherein each of the channels comprises:
- an input selector for connecting selectively an input terminal of the integrator or a reference voltage to a common terminal of the input selector;
- a sampling switch having a first terminal couple to the output terminal of the integrator; and
- a sampling capacitor having a first terminal coupled to a second terminal of the sampling switch, having a second terminal receiving a second reference voltage.

13. The multi-channel integrator of claim 12, wherein the integrator comprises:
- a first operational amplifier (OP-AMP) having a first terminal serving as the input terminal of the integrator, having a second terminal receiving the reference voltage, having an output terminal serving as an output terminal of the integrator;
- a feedback capacitor having a first terminal and a second terminal respectively coupled to the first input terminal and the output terminal of the first OP-AMP; and
- a feedback switch having a first terminal and a second terminal respectively coupled to the first input terminal and the output terminal of the first OP-AMP.

14. The multi-channel integrator of claim 13, wherein during a power-on period, the feedback switch is turned on, and the input selector of each of the channels selectively electrically connects the common terminal to the reference voltage.

15. The multi-channel integrator of claim 13, wherein during a reset period, the feedback switch is turned on, and the input selector of each of the channels selectively electrically connects the common terminal to the reference voltage.

16. The multi-channel integrator of claim 13, wherein during a period of one of a plurality of channel periods for the integrator performing the integrating operation, the feedback switch is turned off, the input selector of a corresponding channel of the channels selectively electrically connects the common terminal thereof to the input terminal of the integrator, and the input selector of each of the other channels selectively electrically connects the common terminal thereof to the reference voltage.

17. The multi-channel integrator of claim 13, wherein during a period after the time when a current one of a plurality of channel periods finishes and before the time when a next one of the plurality of the channel periods does not yet start, wherein the integrator performs the integrating operation during the channel periods, the feedback switch is turned on, and the input selector of each of the channels selectively electrically connects the common terminal to the reference voltage.

18. The multi-channel integrator of claim 13, wherein the first input terminal of the first OP-AMP is an inverting input terminal, and the second input terminal of the first OP-AMP is a non-inverting input terminal.

19. The multi-channel integrator of claim 12, wherein during a period of one of a plurality of channel periods for the integrator performing the integrating operation, the sampling switch of a corresponding channel of the channels is turned on, and the sampling switch of each of the other channels is turned off.

20. The multi-channel integrator of claim 12, wherein the reference voltage includes a high voltage and a low voltage, each of the input selectors of the channels further comprises:
- a first switch having a control terminal, a first terminal serving as the common terminal of the input selector, and a second terminal coupled to the low voltage;
- a second switch having a control terminal, a first terminal coupled to the first terminal of the first switch, and a second terminal coupled to the high voltage;
- a third switch having a control terminal, a first terminal coupled to the first terminal of the first switch, and a second terminal coupled to the integrator;
- a first NOT gate having an input terminal receiving a reset signal, and a output terminal coupled to the control terminal of the first switch;
- a second NOT gate having an input terminal receiving the a control signal;
- a first AND gate having a first input terminal receiving the reset signal, a second input terminal coupled to an output terminal of the second NOT gate, and an output terminal coupled to the control terminal of the second switch; and
- a second AND gate having a first input terminal receiving the reset signal, a second input terminal receiving the control signal, and an output terminal coupled to the control terminal of the third switch.

21. The multi-channel integrator of claim 12, wherein the multi-channel integrator is used to sense a touch panel, and the common terminals of the input selectors are coupled to sensor lines of the touch panel respectively.

* * * * *